United States Patent [19]

Foster et al.

[11] Patent Number: 5,065,228
[45] Date of Patent: Nov. 12, 1991

[54] G-TAB HAVING PARTICULAR THROUGH HOLE

[75] Inventors: Craig A. Foster, Alameda, Calif.; Randolfo Galvez, North Bergen, N.J.; Kurt R. Raab, Sunnvale, Calif.

[73] Assignee: Olin Corporation, New Haven, Conn.

[21] Appl. No.: 333,072

[22] Filed: Apr. 4, 1989

[51] Int. Cl.⁵ .................... H01L 23/14; H01L 23/12
[52] U.S. Cl. ........................ 357/80; 357/71
[58] Field of Search ............... 357/71, 68, 67, 80, 357/70; 204/15; 174/256, 255

[56] References Cited

U.S. PATENT DOCUMENTS

| | | | |
|---|---|---|---|
| 4,551,746 | 11/1985 | Gilbert | 357/68 |
| 4,619,741 | 10/1986 | Minten et al. | 204/15 |
| 4,622,107 | 11/1986 | Piano | 204/15 |
| 4,622,108 | 11/1986 | Polakovic et al. | 204/15 |
| 4,631,117 | 12/1986 | Minten et al. | 204/15 |
| 4,634,631 | 1/1987 | Gazit et al. | 428/421 |
| 4,642,160 | 2/1987 | Burgess | 156/630 |
| 4,647,508 | 3/1987 | Gazit et al. | 428/421 |
| 4,684,560 | 8/1987 | Minton et al. | 428/131 |
| 4,718,993 | 1/1988 | Cupta et al. | 204/15 |
| 4,801,999 | 1/1989 | Hayward et al. | 357/70 |
| 4,874,477 | 10/1989 | Pendleton | 204/15 |
| 4,897,164 | 1/1990 | Piano et al. | 204/15 |

OTHER PUBLICATIONS

"Enhanced Transverse Via/Transtrip," IBM Technical Disclosure Bulletin vol. 29, No. 12, May 1987, pp. 5215-5216.
Tomsa et al., "Multilayer Laminated Chip Carrier", IBM Technical Disclosure Bulletin, vol. 21, No. 4, Sep. 1978, pp. 1396-1397.
Dixon, "TAB Technology Tackles High Density Interconnections", Electronic Packaging and Production, Dec. 1984, pp. 34-39.
Eleccion, "Tape-Automated Bonding Pushes in New Directions", Electronics, Sep. 3, 1987, pp. 90-92.
Lane et al., "Electrical Characteristics of Copper/-Polyimide Thin-Film Multilayer Interconnects", IEEE Transaction on Components, Hybrids, and Manufacturing Technology, vol. CHMT-10, No. 4, Dec. 1987, pp. 577-585.
Burggraaf, "TAB For High I/O and High Speed", Semiconductor International, Jun. 1988, pp. 72-77.
Scarlett, "The Multilayer Printed Circuit Board Handbook", Chapter 12 "Electronic Plating" Electrochemical Publications Limited, 1985, pp. 306-325.

Primary Examiner—Rolf Hille
Assistant Examiner—S. V. Clark
Attorney, Agent, or Firm—Gregory S. Rosenblatt; Paul Weinstein

[57] ABSTRACT

A thin, preferably flexible circuit having multiple conductive planes separated by a non-conductive layer is provided. Conductive vias electrically interconnect the conductive planes. The conductive vias comprise carbon coated blind vias which are made conductive by the electrolytic deposition of a metal on the carbon. The invention is particularly suited for G-TAB wherein a first metal plane is patterned into signal plane circuit traces and a second metal plane is patterned into ground plane traces.

11 Claims, 3 Drawing Sheets

G-TAB HAVING PARTICULAR THROUGH HOLE

While the invention is subject to a wide range of applications, it is especially suited for the manufacture of interconnect circuits having a plurality of conductive planes separated by dielectric layers with conductive vias to electrically interconnect the conductive planes. More particularly, the invention relates to the manufacture of tape automated bonding leadframe assemblies including both a signal plane and a ground or power plane.

Conventional packages suitable for housing a microelectronic device, such as a silicon based semiconductor integrated circuit, comprise a housing formed by bonding a base component to a cover component. An enclosure is provided within the housing to encapsulate the device. An electrically conductive leadframe passes through the housing so that power and electrical signals may be transmitted from the outside environment to the electronic device.

To electrically connect the integrated circuit device to the leadframe, thin, typically on the order of 1 mil diameter, bonding wires are utilized. These wires are typically manufactured from gold, aluminum or an aluminum alloy. The wires are bonded to small bonding pads on the surface of the semiconductor device by a process such as ultrasonic bonding or thermocompression bonding.

As semiconductor devices become more complex as for example in very large scale integration (VLSI) integrated circuits, limitations with conventional wire bonding have become a problem.

The limitations with wire bonding include lead spacing. In general, gold ball wire bonds require 3 mil×3 mil bonding pads with a 6 mil spacing between bonding pad centerlines. Further, in high speed VLSI circuits, lead impedance also becomes a problem at signal frequencies above about 50 MHz. The round, irregularly spaced bond wires introduce large lead inductances and lead-to-lead capacitance resulting in propagation delay and signal distortion.

One solution to the lead density and electrical limitations of conventional wire bonding is the use of TAB leads. TAB is an acronym for tape automated bonding leadframe assemblies. TAB utilizes a metal tape which is usually wrought copper or electrodeposited copper and may be plated with a second metal such as gold, nickel or tin. The tape is formed into a plurality of individual sites. Each site defines a plurality of narrow leads arranged to extend outwardly from the integrated circuit device. The inner lead portions of the tape are bonded to the bonding pads of the integrated circuit and the outer lead portions are bonded to the leadframe, a circuit board or other external circuitry.

TAB is suitable for increased density electronic circuits. TAB is routinely capable of 2 mil×2 mil bonding pads with 4 mil centerlines. Thus using TAB, either the integrated circuit chip may be made smaller or more input/output (I/0) pads may be provided per unit area.

Also, TAB leadframes are generally characterized by shorter lead lengths, larger cross sectional areas and more uniform spacings between leads than wire bonding systems. As a result, the electrical performance of the TAB leads is superior in high speed applications.

A more detailed review of the performance of TAB leads as compared to conventional wire bonding may be found in TAB TECHNOLOGY TACKLES HIGH DENSITY INTERCONNECTIONS by Dixon, TAPE-AUTOMATED BONDING PUSHES IN NEW DIRECTIONS by Eleccion and TAB FOR HIGH I/O AND HIGH SPEED by Burggraaf all of which are incorporated by reference herein.

There are three general forms of TAB construction. The first is the single layer or all metal construction; the second is a two layer construction comprising a metal layer with a dielectric backing; and the third is a three layer construction comprising a metal layer adhesively bonded to a dielectric backing. The dielectric backing may be any dielectric with suitable properties for TAB processing and subsequent packaging. One exemplary dielectric material is a polyimide known as KAPTON and manufactured by DuPont. The dielectric thickness ranges from about 2 mils up to about 5 mils with the thinner backing being applied to the two layer tape and the thicker backing to the three layer tapes. The metal foil layer is typically copper or a copper alloy and is generally quite thin. Typically, the copper foil layer is from about one-half to about six mils thick. The leads patterned from the foil are on the order of about 2 mils wide and a 2 mil×2 mil lead cross section is quite typical. A general review of TAB technology is disclosed in the above referenced article by Dixon.

The majority of the leads in a TAB leadframe are utilized for the transmission of electrical signals to and from the electronic device. Other leads are reserved to supply power or provide grounding. Better electrical performance may be obtained by providing a TAB leadframe having two metal layers. In the two metal layer structure which is commonly referred to as the G-TAB, the first metal layer is patterned into leads. The leads are dedicated to transmitting electrical signals to and from the device. This metal layer is commonly referred to as the signal plane. The second metal layer is patterned into a plurality of circuits to supply a ground and power to the device. This layer is typically called the ground plane.

The two metal layer circuit may be fabricated from either a two or a three layer TAB structure. The basic two metal layer circuit may comprise two conductive layers bonded directly to a dielectric layer. Alternatively, the two conductive layers may be adhesively bonded to the dielectric layer.

The electrical performance advantages of the multiple metal layers has been recognized in the above referenced article by Burggraaf as well as in ELECTRICAL CHARACTERISTICS OF COPPER/POLYIMIDE THIN-FILM MULTILAYER INTERCONNECTS by Lane et al. U.S. Pat. Nos. 4,634,631 and 4,647,508 disclose multiple metal layer flexible circuits of the type using an adhesive to bond the metal layers to a dielectric carrier layer.

A two metal layer tape assembly employing cross over leads is disclosed in U.S. Pat. No. 4,801,999.

A problem with the development and use of multiple metal layer flexible circuits for TAB applications is providing a means to electrically interconnect the signal plane and the ground plane. Conventional multi-layer assembly processes as used in the printed circuit board industry have not proven satisfactory. In printed circuit board applications, the vias are formed between at least two conductive layers which are separated by a dielectric layer such as an epoxy/glass composite. The vias are formed by a process such as drilling.

The vias used for printed circuit board interconnects differ from those applicable to G-TAB in at least two aspects. The diameter of the via is much smaller in G-TAB. The typical G-TAB via is on the order of from about 2 mils in diameter to about 5 mils in diameter, almost an order of magnitude less than the diameter of printed circuit board vias which are on the order of about 20 mils to about 40 mils in diameter.

The second difference between vias interconnecting G-TAB layers and vias used in printed circuit boards is that unlike printed circuit board vias which are usually through holes, G-TAB vias are preferably blind holes. The preferred G-TAB vias do not extend all the way through the interconnect tape. Generally the vias are open at the ground plane and terminate at an interior surface of the signal plane.

Blind vias rather than through holes are used in G-TAB applications due to the difficulty aligning the narrow circuit traces utilized in G-TAB. Rather than 20 mil wide circuit traces separated by 20 mil spaces as in conventional printed circuit board applications, G-TAB leadframes may have 2 mil wide circuit traces separated by 2 mil wide spaces.

Laser ablation has been successfully applied to provide blind vias in multilayer printed circuit boards as well as multilayer laminated chip carriers as disclosed in U.S. Pat. No. 4,642,160 as well as in an IBM Technical Disclosure Bulletin entitled MULTILAYER LAMINATED CHIP CARRIER by Tomsa et al both of which are incorporated by reference herein.

Once the blind via is formed, the via must be made electrically conductive. Through holes for printed circuits are usually made electrically conductive by an electroless copper deposition process. The copper forms at the edges of the conductive layers and gradually bridges the hole to form a thin conductive layer. The thin conductive layer is then built up to a desired thickness by conventional copper electroplating. The process including suggested activation steps as well as catalysts is described in Chapter 12, entitled "Electroless Plating" of THE MULTILAYER PRINTED CIRCUIT HANDBOOK by Scarlett. The electroless processes have several commercial disadvantages. They require a relatively long process time. Multiple treatment baths are required. The multiple baths have complex chemistries and require constant monitoring and frequent additions. The catalyst, frequently palladium/tin may require expensive waste treatment. The electroless baths are very sensitive to contamination. Finally, the multiplicity of rinse baths may require large amounts of water.

Another means to form conductive vias is disclosed in U.S. Pat. Nos. 4,631,117 and known as the BLACK-HOLE ® process. The BLACKHOLE ® process, developed by Olin Hunt specialty Products, Inc. of Palisades Park, N.J., involves forming a dispersion of carbon black in a liquid medium with a surfactant. The dispersion is applied to the surfaces of the non-conducting layer. The liquid medium is then removed leaving behind a carbon layer. The carbon layer may be coated with a conductive material either by electroless plating or by electroplating as disclosed in U.S. Pat. No. 4,684,560. The application of this process to printed circuit board having through holes is disclosed in U.S. Pat. Nos. 4,619,741, 4,631,117 and 4,684,560 which are incorporated by reference herein.

The environment within a blind via or small diameter through hole is not analogous to the environment within large diameter through holes. Large diameter through holes facilitate the flow of solution. As reactants are depleted, fresh solution is available to continue the reaction.

In G-TAB and other thin circuits, solution flow is restricted. The replenishment of solution within the blind vias or narrow through holes is limited. The small volume of solution trapped within the hole is rapidly depleted of reactants. The chemical reaction becomes self-limiting. For this reason, a conventional printed circuit board process such as electroless deposition is believed to be inferior to the process of the invention.

The process disclosed in the above cited U.S. Pat. Nos. 4,619,741, 4,631,117 and 4,684,560 provides a dispersion of carbon in a medium which is contacted to the walls of through holes. When the dispersing medium is removed, a coating of conductive carbon remains behind.

The above referenced United States patents disclose the applicability of the carbon black process for through holes having a diameter of greater than about 0.5 millimeters, that is about 20 mils. As disclosed hereinbelow, the inventors have developed a process incorporating the carbon black process as well as modifications thereof whereby vias having diameters of about 2 mils may be made conductive. While the vias are preferably blind, the process may also be applied to narrow through holes which are similarly unsuitable for electroless plating.

In accordance with the invention, the inventors have provided a process for the manufacture of G-TAB which provides conductive vias in blind holes having a diameter of about 5 mils or less. The process requires less processing steps than usually required for the carbon black process. Further, the process is readily controllable and avoids metal build-up on the thin G-TAB leads. It is an advantage that G-TAB circuits having electrically interconnective ground planes and signal planes may be readily constructed. These circuits have better electrical characteristics than presently produced single metal layer TAB and better controlled signal speeds.

Accordingly, there is provided a process for the manufacture of an interconnect circuit having first and second conductive planes separated by a nonconductive layer. The first conductive plane is patterned into a desired signal plane and the second conductive layer is patterned into a desired ground and power plane. At least one electrically conductive blind hole via connects the two conductive planes and is made electrically conductive by contacting the non-conductive walls of the via with a liquid dispersion of carbon black. The dispersing medium is removed leaving carbon black particles in a substantially continuous layer. The carbon coated walls of the via are then coated with copper to a thickness of about 1 mil by electroplating. Upon removal of the plating resist, a G-TAB with electrically interconnected ground planes and signal planes is provided.

The objects, features and advantages of the G-TAB manufacturing process and the G-TAB so manufactured as well as other objects, features and advantages will be made more clear by the following specification and accompanying drawings.

Figure 1:
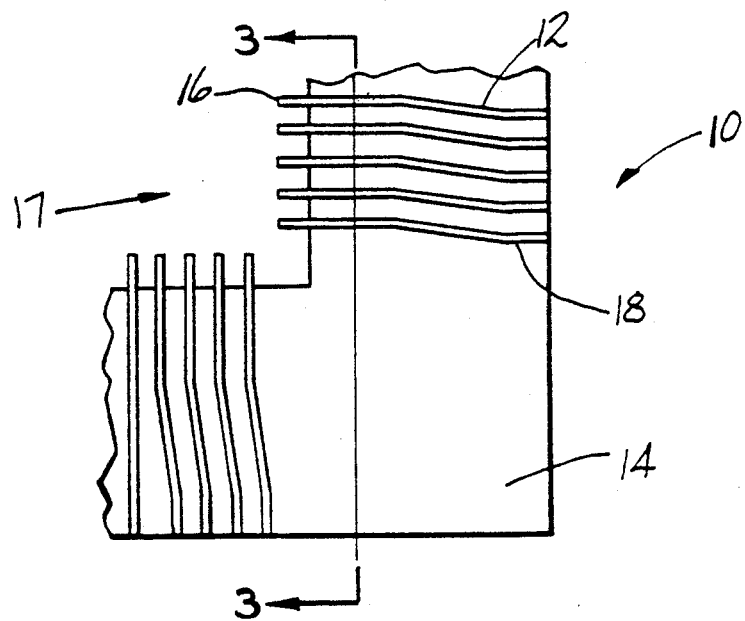
FIG. 1 shows a planar view of the signal plane of a G-TAB in accordance with the invention.
Figure 2:
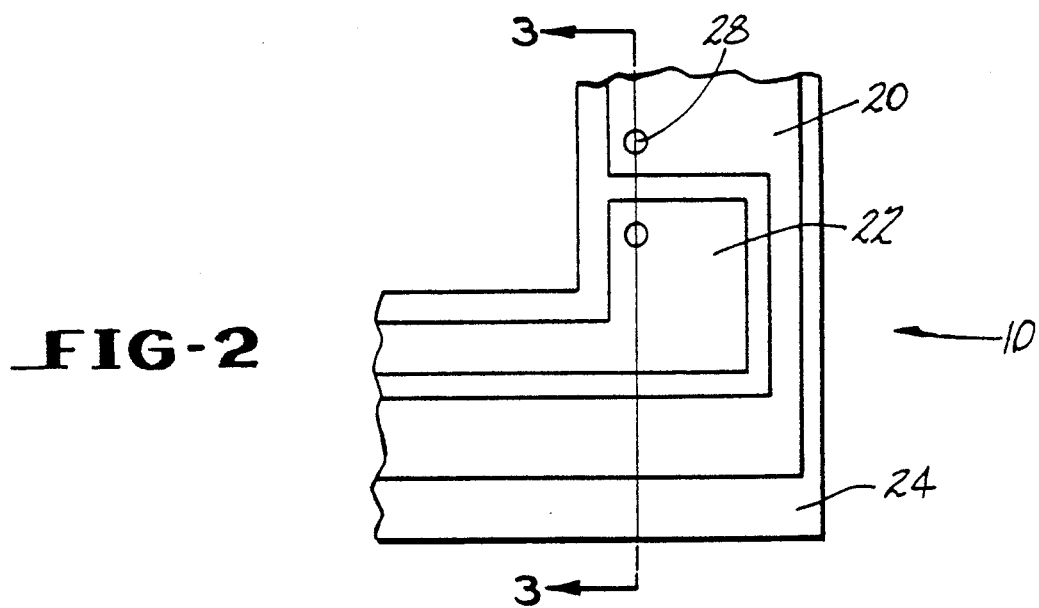
FIG. 2 shows a planar view of the ground plane of a G-TAB in accordance with the invention.
Figure 3:
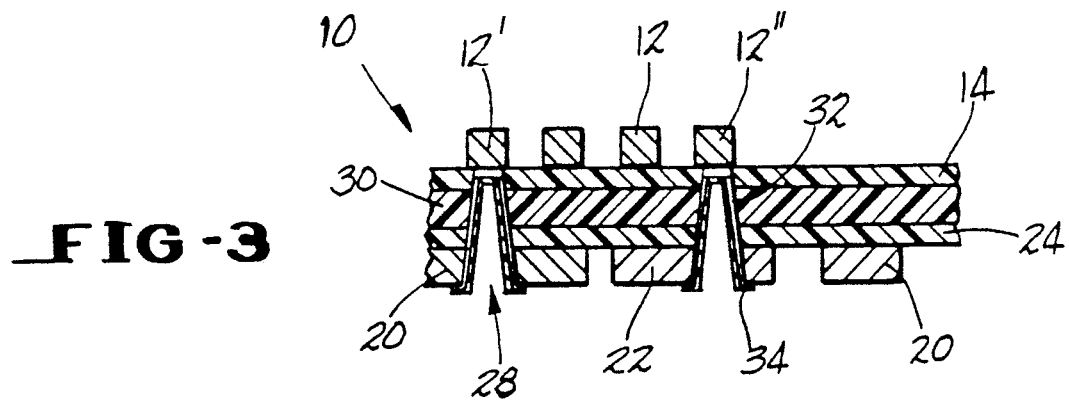
FIG. 3 shows in cross-sectional representation an electrically conductive blind interconnection in accordance with the invention.

FIG. 1 through FIG. 3 illustrate in planar and cross-section representations the construction of a G-TAB in accordance with the invention. While the figures illustrate a G-TAB, the structures and the process of manufacture are readily applicable to any desired multi-layer thin circuit construction as well as any multi-layer structure having narrow width circuit traces and requiring electrical interconnection between conductive layers.

FIG. 1 illustrates in planar view the signal plane of a five layer G-TAB 10. The signal plane is patterned into a plurality of circuit traces 12 bonded by an adhesive 14 to a flexible dielectric carrier. The circuit traces 12 are preferably as narrow as possible to maximize the number of leads. Preferably the circuit traces 12 are less than about 5 mils wide separated by 5 mil spaces. 2 mil wide circuit traces separated by 2 mil wide spaces are typical by current manufacturing techniques. Future technology advances will permit closer spacing. As will become apparent from the description, the process of the invention is also applicable to the finer lined circuitry.

The circuit traces 12 of the G-TAB 10 contain inner leads 16 which extend in cantilever fashion into a previously formed personality window 17. An integrated circuit device such as a silicon based semiconductor circuit (not shown) is positioned within the personality window 17 and contains input/output pads. The input/output pads are bonded to the inner leads 16. The opposite end of the circuit traces 12 form the outer leads 18 which are bonded to a leadframe, printed circuit board or other external circuitry. By conducting electrical signals between the integrated circuit device and the external circuitry, the signal traces allow communication between the device and another electrical subassembly such as an integrated circuit, electronic package or printed circuit board.

FIG. 2 illustrates in planar view the power and ground plane (conventionally referred to as the "ground plane") of the five layer G-TAB 10 illustrated in FIG. 1. The ground plane is patterned into ground circuits 20 and power circuits 22 bonded to the flexible dielectric carrier by a second adhesive layer 24. The ground circuits 20 and power circuits 22 are much wider than the circuit traces of FIG. 1. Typically, the widths of the ground and power circuits are from about 10 mils and up. In an embodiment having increased structural integrity, the entire ground plane is a metal layer. Generally all outer leads 18 and contact with external circuitry originate in the signal plane. However, the processes of the invention are also applicable to embodiments in which outer leads are also present in the ground plane.

Conductive apertures 28 originate at the ground circuit 20 or the power circuit 22 and extend through the layers of the G-TAB or other thin circuit. As will be more fully described with reference to FIG. 3, the conductive apertures electrically inter connect the circuits of the ground plane to the circuits of the signal plane.

FIG. 3 illustrates in cross-sectional representation the five layer G-TAB 10 of FIGS. 1 and 2 as viewed along cross section line 3←→3. The G-TAB 10 is supported by a thin dielectric carrier layer 30. The dielectric carrier layer 30 is any thin electrically nonconducting material. A preferred material for the dielectric carrier layer 30 is a polyimide such as KAPTON manufactured by Dupont. The thickness of the dielectric carrier layer is typically from about 1 mil to about 10 mils and preferably from about 1.5 to about 5 mils thick. KAPTON at thickness within the range of the invention is flexible as are most other dielectric carriers. While the circuits of the invention are preferably flexible, thin rigid circuits are also within the scope of the invention.

First 14 and second 24 adhesive layers are disposed on both sides of the dielectric carrier layer 30. Any adhesive which is sufficiently flexible and may be cured with a suitable bonding cycle may be utilized. A preferred adhesive is phenolic butyral. The adhesives 14,24 are preferably as thin as possible while still providing good adhesion of the metal layers 12,20,22 to the dielectric carrier layer 30. The adhesive layers 14 and 24 are typically less than about 1.0 mil and preferably, from about 0.4 to about 0.6 mils thick.

The circuitry 12, 20 and 22 is formed from a conductive metal foil. Copper and copper based alloys are preferred. These metals have high electrical conductivity, good ductility and are easily etched by common chemical reagents. Most preferred copper alloys include copper alloy C110, also known as electrolytic tough pitch copper (99.90% by weight Cu minimum, 0.05% by weight Oxygen) and copper alloy C1094 (99.9% by weight Cu minimum, 0.07% by weight Ag minimum). Copper alloys C110 and C1094 are characterized by an electrical conductivity about equal to that of pure copper. The alloys have high yield strengths and resist lead deformation during handling.

The conductive metal foils 12,20,22 are bonded to the adhesive layers 14,24 by lamination. A typical lamination process employs a pressure of from about 200 psi to about 550 psi at a temperature of about 175° C., for about 90 minutes.

Conductive apertures 28 are formed to extend from the ground plane to the signal plane. The apertures preferably extend in this direction and are preferably blind vias. Blind vias are preferred due to the narrow width of the signal plane circuit traces 12. The conductive apertures 28 are from about 2 mils to about 10 mils in diameter and preferably from about 3 mils to about 5 mils in diameter. If the apertures 28 pierce the signal plane, an electrical short between the closely spaced circuit traces is likely.

While blind vias are the preferred embodiment of the invention, narrow through holes may also be employed. The narrow through holes have a diameter equal to or less than the width of the signal plane circuit traces. Preferably, the diameter of the narrow through holes is from about 1 mil to about 2 mils. The process of making these narrow through holes conductive forms an embodiment of the invention.

The conductive apertures 28 serve to electrically interconnect the ground plane and the signal plane so that selected signal plane leads 12' may be grounded and other signal plane leads 12" may be supplied with power. The conductive apertures comprise a layer of carbon 32 to which an electrically conductive layer 34 is deposited. The electrically conductive layer 34 is preferably copper.

Figure 4:
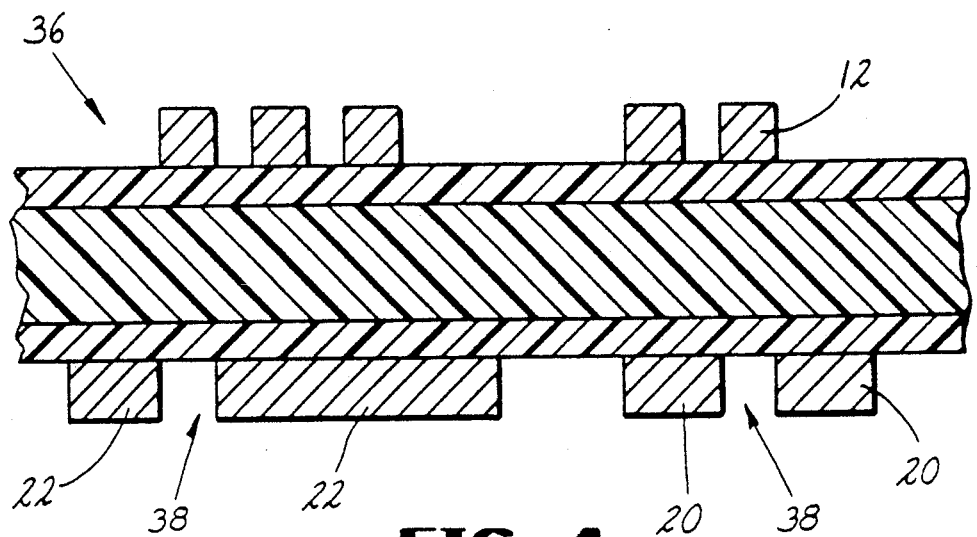
FIGS. 4–7 illustrate in cross-sectional representation the process steps of the method of manufacturing an electrically interconnected two metal layer flexible circuit in accordance with the invention.

The method for the manufacture of the conductive aperture 28 is illustrated in cross-section in FIGS. 4–7. In FIG. 4, a flexible circuit 36 having two metal layers is illustrated. The first metal layer forms the signal plane and is patterned into circuit traces 12. The second metal layer forms the ground plane and is patterned into either ground 20 or power circuits 22 or both.

Patterning of the signal plane and the ground plane may be by any method known in the art, such as resist patterning followed by etching. In this process, the surfaces are coated with a uniformly thick coating of a photoresist. The photoresist is then exposed by a radiation appropriate to the resist type. Exposure takes place through a photomask so that the resist is developed in the desired circuit designs on both the ground plane and signal plane. The ground plane and signal planes may be exposed either simultaneously or in separate operations. After the resist has been patterned, a suitable solvent removes the unexposed resist. Any suitable etch then removes the layers from the exposed regions. After etching, the remaining resist is removed resulting in a desired pattern of circuits on both the ground and signal planes.

While patterning has been described in terms of a negative photoresist, a positive photoresit may also be employed.

In addition to the circuits, apertures 38 are formed within the circuitry of the ground plane. The aperture diameter is selected to be smaller than the width of the ground or power circuit being intersected. Preferably the aperture diameter is from about 2 mils to about 10 mils. The apertures 38 are positioned at a location where a conductive via is desired to electrically interconnect the ground plane to the signal plane.

Figure 5:
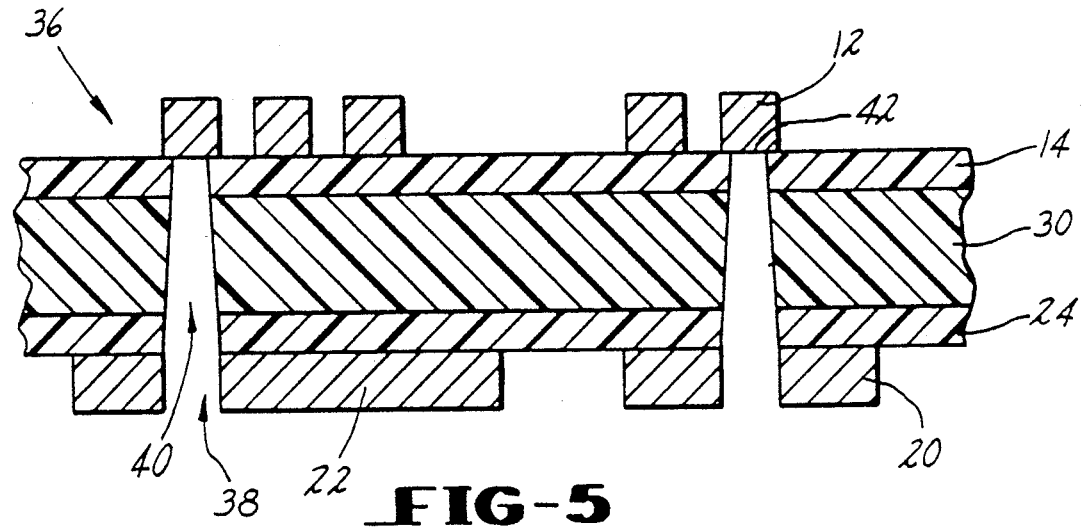

In FIG. 5, non-conductive blind vias 40 extend the apertures 38 to an interior surface 42 of the signal plane circuit traces 12. The blind vias 40 may be formed by any known process such as mechanical drilling, plasma etching, laser vaporization or laser ablation. Laser ablation is the favored technique as alignment is much easier. Preferably, an excimer laser is used which will ablate the polymer layers which comprise the adhesives 14,24 and the dielectric layer 30 but will not penetrate the metallic layers. The metal 20,22 surrounding the apertures 38 accurately aligns the laser beam. The interior surface 42 of the signal plane traces 12 acts as a stop. In this way, accurately positioned vias 40 may be formed.

Figure 6:
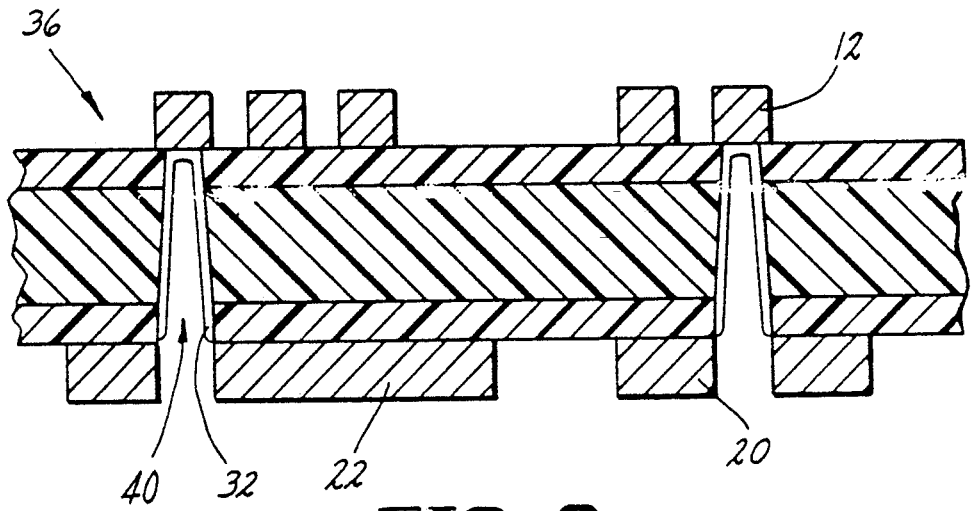

Once the blind vias 40 are in place, a carbon dispersion 32 is applied as shown in FIG. 6. Prior to application of the carbon dispersion, it is preferred to clean the flexible circuit. In one preferred precleaning operation, the flexible circuit is placed in a cleaner/conditioner bath for from about 4 minutes to about 6 minutes at a temperature of from about 130° F. to about 150° F. to remove grease and other impurities from the blind via 40 surfaces. One preferred cleaner/conditioner is principally comprised of monoethanolamine and ethylene glycol in water and is sold under the product name BLACKHOLE® CLEANER 2 by Olin Hunt Specialty Products Inc. of West Patterson, N.J.

After application of the cleaner/conditioner, the flexible circuit is subsequently rinsed in deionized water to remove any residual cleaner/conditioner. A liquid carbon black dispersion is then applied to the cleaned flexible circuit. The dispersion contains three critical ingredients, carbon black, one or more surfactants capable of dispersing the carbon black and a liquid dispersing medium such as water. The preferred method of applying the dispersion is by immersion of the flexible circuit although other methods such as spraying are also applicable. A single working bath is sufficient to apply the carbon dispersion. Multiple baths may be used for rework or other purposes.

To prepare the liquid dispersion, the three critical ingredients along with any other preferred ingredients are thoroughly mixed together to form a stable dispersion. This may be accomplished by subjecting a concentrated form of the dispersion to ball milling, colloidal milling, high shear milling or ultrasonic techniques. The thoroughly mixed dispersion is later diluted with more of the dispersing medium to the desired concentration for the working bath. The preferred method of mixing is ball milling a concentrated form of the dispersion in a container having glass, mineral or plastic beads therein for a period of from about 1 to about 24 hours. This thorough mixing allows for the carbon black particles to be intimately coated or wetted by the surfactant. The working bath is preferably kept agitated during both the dilution and application steps to aid in keeping the dispersion stable.

The carbon black particles should have an average particle diameter below about 3 microns while in the dispersion. It is desirable to have the average particle diameter of carbon black as small as possible to obtain the desired characteristics of substantially even plating and no plating pullaways. It is preferred for the carbon black to have an average particle diameter of from about 0.1 to about 3.0 microns, and most preferably from about 0.2 to about 2.0 microns.

All types of carbon black may be used for this invention including the commonly available furnace blacks. However, it is preferable to utilize those carbon blacks which are initially acidic or neutral, i.e. those which have a pH of between about 1 and about 7.5 and most preferably between about 2 and 4 when slurried with water.

The preferred carbon black particles are porous and generally have surface areas of from about 45 to about 1100 square meters per gram and preferably have surface areas of from about 300 to about 600 square meters per gram by the BET method (method of Brunauer-Emmett-Teller).

Illustrative carbon blacks suitable for the use of this invention include Cabot XC-72R Conductive, Cabot Monarch 800, Cabot Monarch 1300, all manufactured by Cabot corporation of Boston, Mass. Other suitable carbon blacks include Columbian T-10189, Columbian Conductex 975 Conductive, Columbian CC-40-220 and Columbian Raven 3500 all available from Columbian Carbon Company of New York, N.Y. Monarch 800 and Raven 3500 are most preferred because of their ease of dispersion and low pH.

The term "liquid dispersing medium" as used herein includes water and polar organic solvents (both protic and aprotic). Suitable protic polar organic solvents may include lower alcohols ($C_1$–$C_4$) such as methanol, ethanol, isopropanol and isobutanol; polyhydric alcohols such as glycols (i.e. triethylene glycols); ether-alcohols such as cellosolve; organic acids such as formic and acetic acids; acid derivatives such as trichloroacetic acid; and sulfonic acids such as methane sulfonic acid. Suitable aprotic polar organic solvents may include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); dimethylsulfoxide (DMSO); and esters of carboxylic acids such as methylformate, ethylacetate and cellosolve acetate. The preferred liquid dispersing medium is water due to cost and ease of use. The water is preferably deionized to remove lime, fluorine, iodine and other impurities normally found in tap water.

In addition to the dispersing medium and the carbon black, an effective amount of a surfactant is required. Suitable wetting agents include anionic, nonionic and cationic surfactants (or combinations thereof such as amphoteric surfactants). The surfactants should be soluble, stable and preferably nonfoaming in the liquid carbon black dispersion. The preferred type of surfactant will depend mainly on the pH of the dispersion. If the total dispersion is alkaline, an anionic or nonionic surfactant is preferred. Preferred anionic surfactants include neutralized phosphate ester type surfactants such as MAPHOS 55, 56, 8135, 60A and L6 (Mazer Chemical Co.). The most preferred anionic surfactant is MAPHOS 56. Suitable nonionic surfactants include ethoxylated nonyl phenols such as POLY-TERGENT B series (Olin Corporation) or alkoxyated linear alcohols such as POLY-TERGENT SL series (Olin Corporation).

If the total dispersion is acidic, an anionic or cationic surfactant is preferred. Suitable anionic surfactants are described hereinabove. Suitable cationic surfactants include amphoteric potassium salts of a complex amino acid based on fatty amines such as MAFO 13 and MAZEEN S-5 or MAZTREAT (Mazer Chemical Co.). combinations of surfactants may also be employed.

The amount of carbon black in the dispersion is preferably less than about 4% by weight and preferably less than about 2% by weight. Higher concentrations of carbon black tend to lead to undesirable plating characteristics. Likewise, the total solids in the dispersion, that is all ingredients other than the liquid dispersing medium, is preferably less than about 10% by weight and most preferably less than about 5.6% by weight.

The liquid dispersion of carbon black is placed in a suitable agitated vessel and the flexible circuit or G-TAB to be treated is immersed in, sprayed with or otherwise contacted with the liquid dispersion. The temperature of the liquid dispersion in an immersion bath is maintained in the range of from about 15° C. and about 35° C. and preferably in the range of from about 20° C. and about 30° C. while the flexible circuit is immersed. The period of immersion generally ranges from about 1 minute to about 10 minutes and preferably from about 3 minutes to about 5 minutes. During the immersion time, the liquid carbon black-containing dispersion penetrates the blind vias of the flexible circuit and wets and contacts the dielectric carrier layer as well as the adhesive layers. Since the process is simply deposition rather than a chemical conversion, the problems with depletion such as experienced during electroless plating are not encountered.

Upon removal from the dispersion bath, substantially all (ie above about 95% by weight) of the dispersing medium is removed. A dried deposit containing carbon black remains in the blind vias and other exposed surfaces. Removal of the dispersing medium may be accomplished by several means such as evaporation at room temperature in a vacuum or at elevated temperatures in air. Heating at elevated temperature is the preferred method. If the dispersing medium is water, heating is generally carried out for between about 5 and about 45 minutes at a temperature low enough so as not to affect the dielectric carrier layer or the adhesive layers. A preferred temperature range is from about 75° C. to about 93° C. and a most preferred temperature range is from about 80° C. to about 90° C. To insure complete coverage of the walls of the blind vias, the procedure of immersion followed by drying may be repeated one or more times.

After drying, not only are the walls of the blind vias coated, but the conductive traces which form the ground plane and signal plane are also coated as are the adhesive regions between conductive circuits. Removal of the carbon layer from the ground plane and the signal plane while leaving the coating intact within the blind vias may be accomplished by mechanical scrubbing or a microetch. The microetch is preferred because of ease of use. One suitable sodium persulfate microetch is MICROCLEAN 1 available from Olin Hunt Specialty Products Inc. The microetch attacks the first few atomic layers of copper. The carbon layer flakes off in the form of micro-flaklets which may be removed from the solution by suitable filtration. Generally, a one minute immersion in the microetch at room temperature is sufficient to remove the carbon dispersion from the ground and signal planes.

While the microetch readily removes the carbon dispersion from the copper based circuit traces, the microetch is not sufficiently effective to remove the carbon dispersion from the exposed adhesive or dielectric between circuit traces. The carbon dispersion may be removed from the non-metallic regions by any suitable process. Two suitable processes are mechanical scrubbing and ultrasonic cleaning in a mild alkaline solution.

If the ultrasonic process or other chemical process is used to remove the carbon dispersion from the non-metallic regions of the circuit, attack of the carbon dispersion within the blind vias or narrow through holes may take place. Accordingly, if these techniques are employed, the vias are preferably protected by a resit coating or preferably, plated with a conductive metal as described hereinbelow prior to the cleaning step.

The carbon coated vias are made electrical conductive by the deposition of a metal onto the carbon surface. The preferred means of deposition is electrolytic deposition. Unlike printed circuit boards which have relatively wide circuit traces, such as 20 mil lines separated by 20 mil spaces, the G-TAB and other narrow circuits have signal plane circuit traces of 2 mil lines separated by 2 mil spaces. If the entire circuit is immersed in a plating bath, electrodeposited metal would bridge the 2 mil spaces and lead to electrical short circuits.

Figure 7:
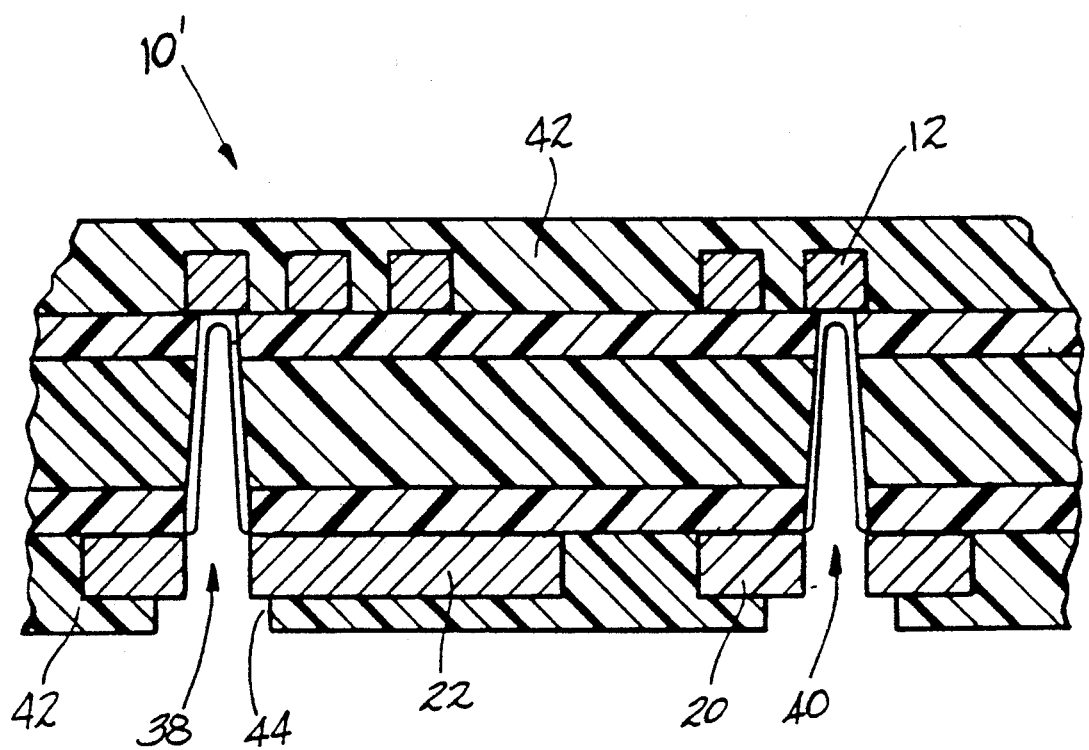

Accordingly, as shown in FIG. 7, both the ground plane circuitry 20,22 and the signal plane circuitry 12 are preferably coated with a second layer of a resist 42. The resist 42 is preferably photo-sensitive so that the resist may be patterned to expose the carbon coated blind vias 40 and a relatively small, on the order of a few mils, region 44 adjacent to the vias. In embodiments of the invention in which the signal plane does not require a patterned resist, any resist may be used.

The resist coated flexible circuit 10' is then immersed in a suitable electroplating bath for applying a conductive coating on the hole walls of the blind vias 40. Any suitable conductive metal which may be deposited by an electrolytic process may be used. Copper is preferred due to its high electrical conductivity and the ready availability of commercial electroplating solutions having high throwing power. Other conductive metals such as nickel, gold, silver or the like may similarly be deposited by electrolytic means.

The present invention contemplates the use of any and all suitable electroplating operations. The deposition process is electrolytically driven and the solution depletion problem detailed hereinabove is mitigated. The claimed invention is not limited to any particular electroplating bath parameters.

A typical copper electroplating bath is comprised of the following components in the following proportions:

| Component | General Proportions | Preferred Proportions |
|---|---|---|
| Copper (as metal) | 2–2.5 oz/gal | 2.25 oz/gal |
| Copper sulfate | 8–10 oz/gal | 9 oz/gal |
| $H_2SO_4$ (by weight) | 20–30 oz/gal | 23 oz/gal |
| Chloride ion | 20–100 mg/l | 50 mg/l |

The electroplating bath is normally agitated and preferably maintained at a temperature of between about 20° C. and about 25° C. The electroplating bath is provided with anodes, generally constructed of copper, and the flexible circuit to be plated is connected as a cathode to the electroplating circuit. A current of, for example, about 10 amps per square foot is impressed across the electroplating circuit for a period of from about 10 minutes to about 45 minutes in order to effect copper plating on the walls of the blind vias 40. The preferred immersion time and current density are those sufficient to deposit an effective thickness of a layer of copper, as designated by reference numeral 34 in FIG. 3. The copper plating provides an electrical interconnection between the ground plane and the signal plane. An effective thickness of copper is that sufficient to make the via electrically conductive. The thickness may vary from a continuous flash up to the diameter of the hole. A preferred thickness of the copper layer is from about 0.5 mils up to about 1 mil.

Upon the attainment of the desired thickness of copper, the thin circuit is removed from the electroplating bath and washed in deionized water to remove residual plating solution. The circuit is then dried by any convenient means such as heating or vacuum evaporation as discussed above.

Finally, the photoresist is removed using a suitable solvent and the two metal layer flexible circuit as illustrated in FIG. 3 is achieved. The electroplated copper 34 is of uniform thickness and does not suffer from voids and pullaway defects.

While the invention has been preferentially described in accordance with a G-TAB type circuit, it is applicable to all multi-layer narrow circuits interconnected by relatively small diameter blind vias. The present technique is readily adaptable to signal planes that have increasingly narrow circuit traces separated by increasingly narrow spaces.

It will be apparent to those skilled in the art that the order of certain process steps may be varied and all such variations are incorporated with the scope of the invention. In particular, the vias may be formed and made conductive prior to the patterning of ground and power circuit traces in the ground plane. By using this embodiment, there will be no necessity to remove carbon from non-metallic surfaces and a microetch alone will be sufficient to remove excess carbon.

The patents, patent applications and publications set forth in this application are incorporated by reference herein.

It is apparent that there has been provided in accordance with this invention a process for the manufacture of electrolytically conductive blind vias to interconnect conductive planes of an electronic circuit and the product produced by that process which fully satisfy the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variation as fall with the spirit and broad scope of the appended claims.

We claim:

1. A thin circuit, comprising:
    a first conductive plane patterned into a plurality of circuit traces, at least one of said circuit traces having a width of less than about 5 mils or separated by spaces of less than about 5 mils;
    a second conductive plane patterned into at least one circuit trace;
    a non-conductive layer disposed between said first and second conductive planes;
    at least one conductive through hole via electrically interconnecting said first and second conductive planes, said conductive through hole via having a diameter of less than about 5 mils comprising:
    a layer of carbon black affixed to the walls of an electrically non-conductive via; and
    a conductive metal bonded to said carbon black.

2. The thin circuit claim 1 wherein the thickness of said non-conductive layer is from about 1.5 mils to about 5 mils.

3. The thin circuit of claim 2 wherein said conductive metal bonded to said carbon black is selected from the group consisting of copper, nickel, gold and silver.

4. The thin circuit of claim 3 wherein said non-conductive layer is flexible and said first conductive layer terminates at inner leads which extend in cantilever fashion into a personality window.

5. The thin circuit of claim 4 wherein said through hole has a diameter of from about 1 mil to about 2 mils.

6. The thin circuit of claim 5 wherein said conductive metal is copper with a thickness of from about 0.5 mils to about 1 mil and said non-conductive layer is polyimide.

7. A thin circuit, comprising:
    a first conductive plane formed into a plurality of circuit traces, at least some of said circuit traces having a width of less than about 5 mils or separated by spaces of less than about 5 mils;
    a second conductive plane formed into at least one circuit trace;
    a non-conductive layer disposed between said first and second conductive planes;
    at least one conductive blind via extending from said conductive plane to an interior surface of a circuit trace formed in said first conductive plane, said blind hole via having a diameter of 5 mils or less and comprising:
    a layer of carbon black affixed to the walls of an electrically non-conductive via; and
    a conductive metal bonded to said carbon black.

8. The thin circuit of claim 7 wherein the thickness of non-conductive layer is from about 1.5 mils to about 5 mils.

9. The thin circuit of claim 8 wherein said conductive metal bonded to said carbon black is selected from the group consisting of copper, nickel, gold and silver.

10. The thin circuit of claim 9 wherein said blind hole via has a diameter of from about 3 mils to about 5 mils.

11. The thin circuit of claim 10 wherein said conductive metal is copper with a thickness in the range of from about 0.5 mils to about 1 mil and said non-conductive layer is polyimide.

* * * * *